(12) United States Patent
Nakano et al.

(10) Patent No.: US 8,253,029 B2
(45) Date of Patent: Aug. 28, 2012

(54) FILTER CIRCUIT ELEMENT AND ELECTRONIC CIRCUIT DEVICE

(75) Inventors: Takashi Nakano, Tokyo (JP); Masaharu Imazato, Tokyo (JP); Yoji Nishio, Tokyo (JP)

(73) Assignees: NEC Corporation, Tokyo (JP); Elpida Memory, Inc., Tokyo (JP)

( * ) Notice: Subject to any disclaimer, the term of this patent is extended or adjusted under 35 U.S.C. 154(b) by 353 days.

(21) Appl. No.: 12/450,690

(22) PCT Filed: Apr. 9, 2008

(86) PCT No.: PCT/JP2008/057003
§ 371 (c)(1),
(2), (4) Date: Oct. 7, 2009

(87) PCT Pub. No.: WO2008/133010
PCT Pub. Date: Nov. 6, 2008

(65) Prior Publication Data
US 2010/0096174 A1    Apr. 22, 2010

(30) Foreign Application Priority Data
Apr. 12, 2007   (JP) ................ 2007-104838

(51) Int. Cl.
H05K 1/18         (2006.01)
H05K 1/11         (2006.01)
(52) U.S. Cl. ......... 174/260; 333/33; 333/204; 333/24 C; 174/266
(58) Field of Classification Search .......... 174/250–268; 333/24 C, 33, 204; 361/803, 794, 306.3
See application file for complete search history.

(56) References Cited

U.S. PATENT DOCUMENTS 5,406,235 A * 4/1995 Hayashi ................ 333/204
5,952,709 A * 9/1999 Kitazawa et al. ........ 257/664

(Continued)

FOREIGN PATENT DOCUMENTS
JP           4-317202        11/1992
(Continued)

OTHER PUBLICATIONS

Konishi, et al., "Design and application of a filter circuit for communication", Apr. 5, 1997, Second edition, pp. 57 and 112.

Primary Examiner — Angel R Estrada
Assistant Examiner — Dimary Lopez
(74) Attorney, Agent, or Firm — McGinn IP Law Group, PLLC

(57) ABSTRACT

A plurality of vias is disposed side by side on a multilayer board. A first via which is one of the vias disposed at one outer portion is electrically connected to a first outgoing line provided on the multilayer board. A second via at the other outer portion is electrically connected to a second outgoing line provided on the multilayer board. A plurality of the vias is connected to a first fixed potential layer (a ground layer, for example) of the multilayer board. At least one second fixed potential layer is provided, with a plurality of the vias through a clearance and having the same potential as that of the first fixed potential layer, as an inner layer of the multilayer board between the first and second outgoing lines and the fixed potential layer. Therefore, a BPF whose rate of occupied area is low is formed on the multilayer board without additional production processes.

20 Claims, 21 Drawing Sheets

U.S. PATENT DOCUMENTS

| | | | |
|---|---|---|---|
| 6,329,604 B1 * | 12/2001 | Koya | 174/255 |
| 6,483,175 B2 * | 11/2002 | Yoshida | 257/665 |
| 6,521,843 B1 * | 2/2003 | Kohya | 174/255 |
| 6,853,054 B2 * | 2/2005 | Baba et al. | 257/635 |
| 6,972,646 B2 * | 12/2005 | Hirabayashi | 333/204 |
| 2003/0102941 A1 | 6/2003 | Amano et al. | |
| 2004/0009683 A1 | 1/2004 | Hiraoka et al. | |

FOREIGN PATENT DOCUMENTS

| | | |
|---|---|---|
| JP | 2000-242674 | 9/2000 |
| JP | 2001-77498 | 3/2001 |
| JP | 2002-26605 | 1/2002 |
| JP | 2002-94302 | 3/2002 |
| JP | 2002-171193 | 6/2002 |
| JP | 2004-39897 | 2/2004 |
| JP | 2005-33264 | 2/2005 |
| JP | 2005-116544 | 4/2005 |
| JP | 2005-277028 | 10/2005 |
| JP | 2005-277962 | 10/2005 |
| JP | 2006-14009 | 1/2006 |
| JP | 2006-129215 | 5/2006 |
| JP | 2006-269627 | 10/2006 |

* cited by examiner

FIG. 53
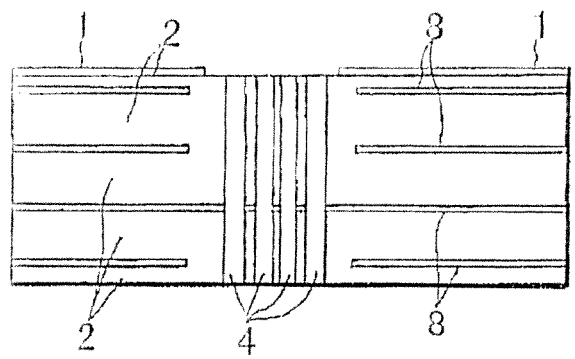
FIG. 54
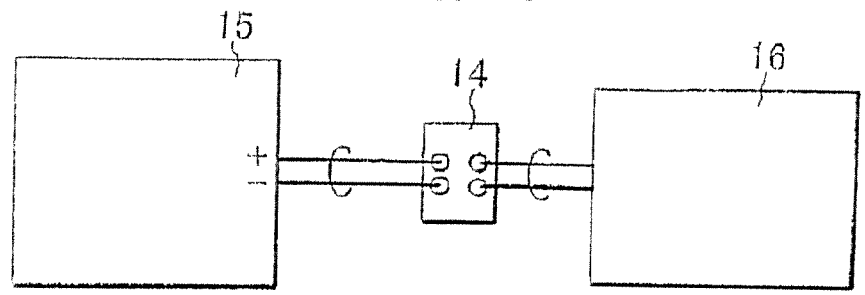
RELATED ART    FIG. 55
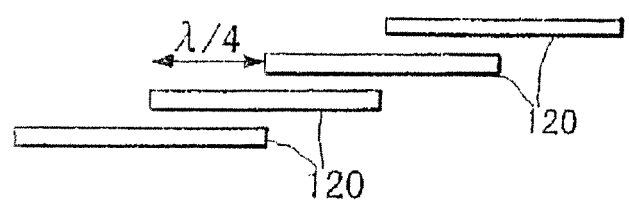

FILTER CIRCUIT ELEMENT AND ELECTRONIC CIRCUIT DEVICE

TECHNICAL FIELD

The present invention relates to a filter circuit element and an electronic circuit device, and particularly relates to a filter circuit element and an electronic circuit device that are formed on a multilayer board. The present application claims priority from Japanese Patent Application No. 2007-104838 filed on Apr. 12, 2007, the contents of which being incorporated herein by reference.

BACKGROUND ART

LSIs have had a remarkable increase in signal transmission speed. Now, 10-Gbps transmission is available. Moreover, research is under way, aiming at 40-Gbps or 100-Gbps transmission speed. The 40-Gbps or 100-Gbps transmission speed is in the range of microwave rather than in the range of electric circuits. Digital signals are currently transmitted in the form of a square wave, but in reality the shape is close to a sine wave. However, depending on the signal pattern, low frequency components may be included. When the transmission speed becomes faster, the amount of frequency components to be transmitted should be small because it is easy to perform impedance matching and to make transmission characteristics better. Since a microwave circuit modulates carrier waves to transmit signals, the bandwidth of the signals is far narrower than that of the current digital signals. It is expected in the future that like the microwave circuit, the LSI will modulate carrier waves to transmit digital signals. In such a case, a band pass filter needs to be formed on a LSI printed board.

In the range of microwave circuits, the impedance varies according to the length, and there is no clear classification like inductance (L) or capacitance (C). As shown in FIGS. 55, 56 and 57, a band pass filter (BPF) is formed with the help of resonance on the length of which is $\lambda/4$ ($\lambda$ represents wavelength) or the like. In FIG. 2.50 on page 57 of Non-Patent Document 1, the configuration of the BPF in FIG. 55 is illustrated and in FIG. 3.19 on page 112, the configuration of the BPF in FIGS. 56 and 57 is illustrated.

In FIG. 55, a planar BPF is formed with the use of microstrip lines (MSLs). The microstrip lines 120 overlap each other by $\lambda/4$. In FIGS. 56 and 57, a three-dimensional BPF is formed with lines formed in high dielectric ceramics. In a boxy ground 224 including the upper surface of which does not have a conductor while the other surfaces have conductors, two stub conductors 221 and 222 are formed. The lower ends of the stub conductors 221 and 222 are connected to the lower surface of the boxy ground conductor 224. The box is filled with a dielectric material 223.

As a technique relevant to the present invention, Patent Document 1 describes the structure of a board for high-speed transmission suitable for differential transmission, where a ground plane is disposed around a via for impedance matching. Patent Document 2 describes a multilayer circuit board where a signal line passes through between two non-conductive areas in a plane that exists on a different layer from a layer having the signal line.

Patent Document 1: JP-A-2005-277028
Patent Document 2: JP-A-2005-116544
Non-Patent Document 1: "Design and application of a filter circuit for communication," Yoshihiro Konishi, Sougou Denshi Syuppan, Apr. 5, 1997, Second edition, pp. 57 and 112

DISCLOSURE OF THE INVENTION

Problems to be Solved by the Invention

However, in the case of the configuration of FIG. 55, the occupied area increases as the number of MSLs 120 increases. Moreover, the configuration illustrated in FIGS. 56 and 57 is not suitable for forming the band pass filter on the LSI printed board.

The objective of the present invention is to provide a filter circuit element and an electronic circuit device which are formed for a high-speed transmission circuit and can form, on a LSI printed board, a BPF whose rate of occupied area is small.

Means for Solving the Problems

In a filter circuit element according to the present invention, a plurality of vias is disposed side by side on a multilayer board; one of the vias at one end portion is electrically connected to a first outgoing line provided on the multilayer board, and a via at the other end portion is electrically connected to a second outgoing line provided on the multilayer board; the plurality of vias is connected to a first fixed potential layer of the multilayer board; and one or more second fixed potential layers are provided as inner layers of the multilayer board between the first and second outgoing lines and the fixed potential layer. The one or more second fixed potential layers is disposed away from the plurality of vias by a clearance and whose potential is the same as that of the first fixed potential layer. Here, the via is a connection area through which the lower layer is electrically connected to the upper layer, and the via is formed by etching the dielectric layer of the multilayer board to form a via hole and putting a metallic material into the via hole.

Moreover, in a filter circuit element according to the present invention, lines having the length of one-half of a target effective wavelength are formed on a plurality of layers of a multilayer board, and the lines are so arranged as to partly overlap each other in such a way that each of the lines becomes shifted from a neighboring line by one-quarter of the target effective wavelength in the direction of the length.

According to the present invention, an electronic circuit device uses the above filter circuit element of the present invention.

Advantages of the Invention

According to the present invention, the filter circuit element whose rate of occupied area is low is formed on the multilayer board without additional production processes and with a small amount of radiation noise.

BRIEF DESCRIPTION OF THE DRAWINGS

FIG. 53 is a vertical cross-sectional view of FIG. 51 taken along the line X2-X2'.

FIG. 54 is a diagram illustrating the configuration of an electronic circuit device according to the present invention.

FIG. 55 is a diagram illustrating an example of the configuration of a planar BPF formed with the use of MSL (Micro Strip Line).

EXPLANATION OF REFERENCE SYMBOLS

Figure 1:
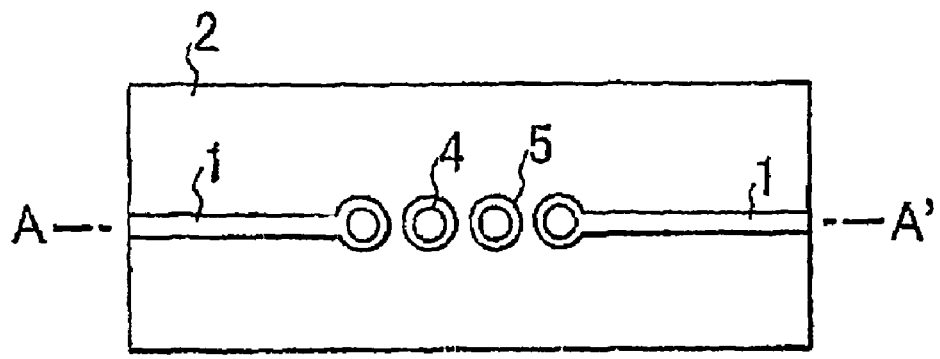
FIG. 1 is a top view of a filter circuit element according to a first embodiment of the present invention.

1: MSL (Micro Strip Line)
2: Dielectric material
3: Ground layer
4: Via
5: Land
6: Via
7: Dielectric material
8: GND layer
9: Clearance
10: Differential line
11: Line inside PCB
12: Via
13: GND layer
14: Band pass filter (BPF)
15: Signals generation circuit
16: Electonic device
20: MSL
21: Conductor (Input)
22: Conductor (Output)
23: Dielectric material
24: Conductor

BEST MODE FOR CARRYING OUT THE INVENTION

The following describes in detail exemplary embodiments of the present invention with reference to the accompanying diagrams.

First Embodiment

Figure 2:
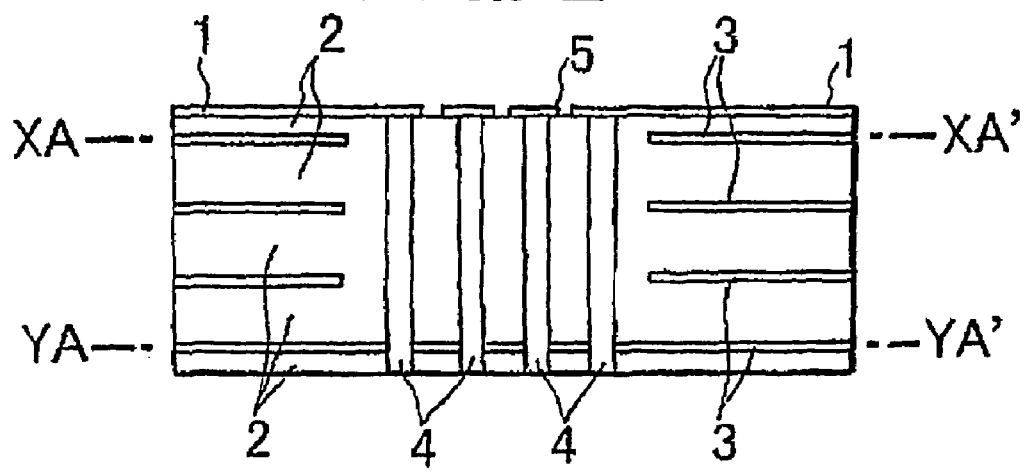
FIG. 2 is a vertical cross-sectional view of FIG. 1 taken along the line A-A'.
Figure 3:
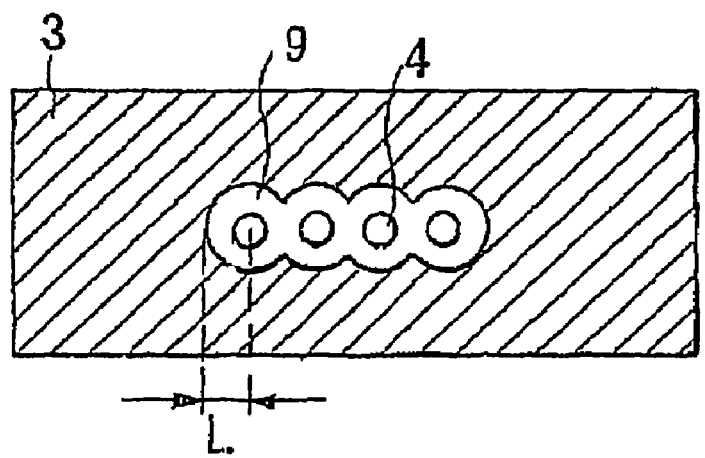
FIG. 3 is a lateral cross-sectional view of FIG. 2 taken along the line XA-XA'.
Figure 4:
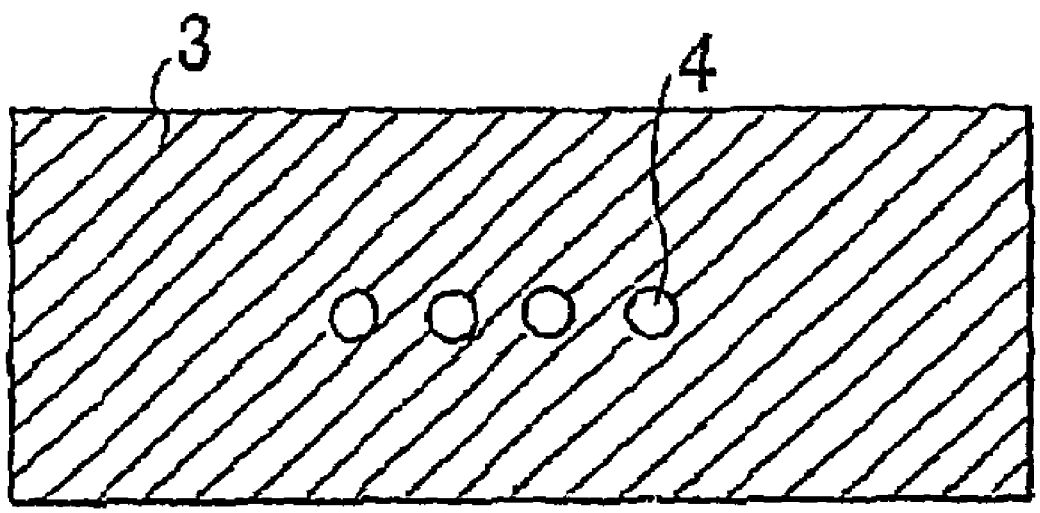
FIG. 4 is a lateral cross-sectional view of FIG. 2 taken along the line YA-YA'.
Figure 5:
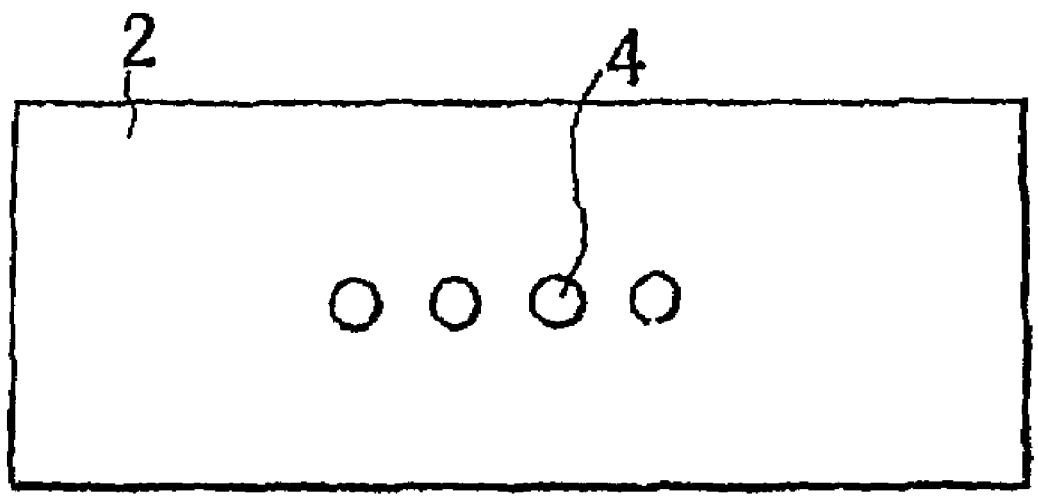
FIG. 5 is a bottom view of the filter circuit element according to the first embodiment of the present invention.
Figure 6:
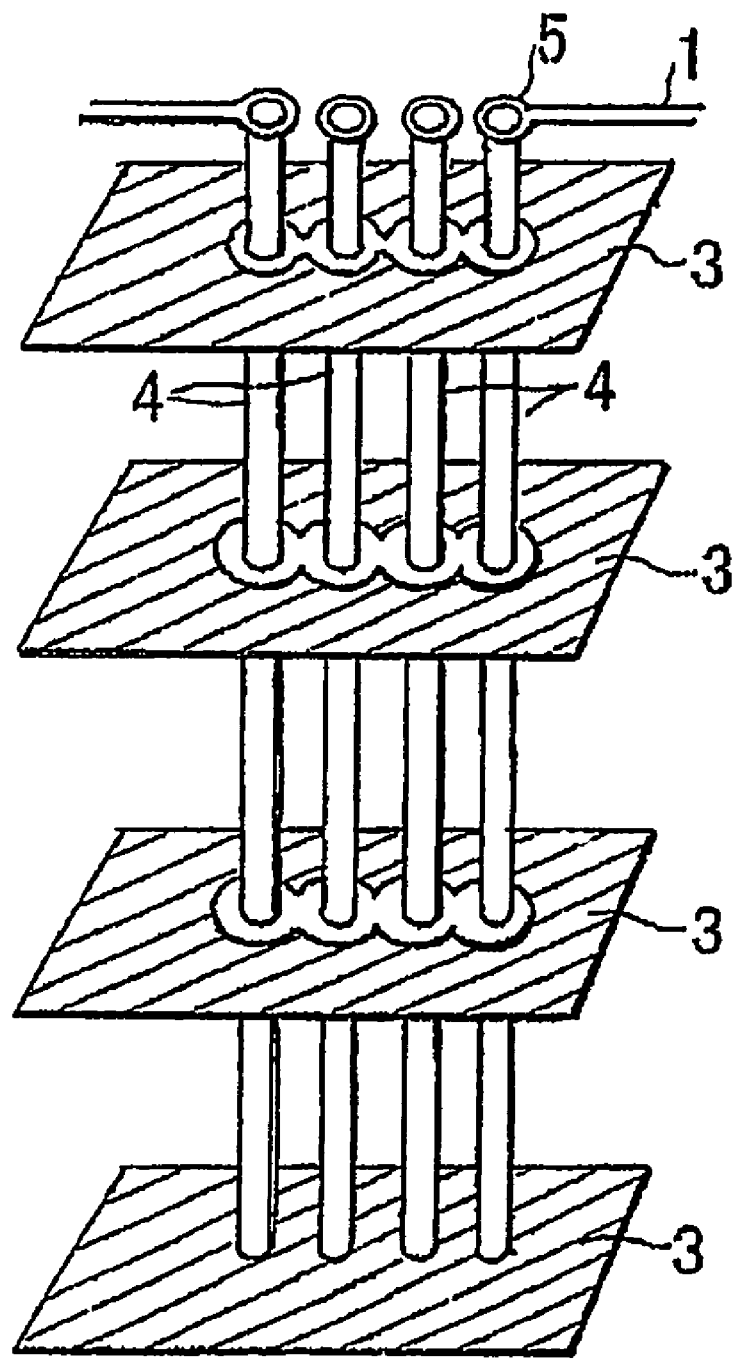
FIG. 6 is an exploded perspective view illustrating the filter circuit element except a dielectric material.

FIGS. 1 to 6 are diagrams illustrating the configuration of a filter circuit element according to a first embodiment of the present invention. FIG. 1 is a top view of the filter circuit element. FIG. 2 is a vertical cross-sectional view of FIG. 1 taken along the line A-A'. FIG. 3 is a lateral cross-sectional view of FIG. 2 taken along the line XA-XA'. FIG. 4 is a lateral cross-sectional view of FIG. 2 taken along the line YA-YA'. FIG. 5 is a bottom view of the filter circuit element. FIG. 6 is an exploded perspective view illustrating the filter circuit element except a dielectric material.

On a multilayer board, a plurality of vias 4 (here, the number of vias is four) are formed side by side through a dielectric material 2 (FR4($\in$r≅4)). Board conductors 3 are made of Cu, and the dielectric material 2 (FR4($\in$r≅4)) fills up a space between the board conductors 3. The board conductors 3 are set at ground (GND) potential, and serve as ground layers. In a via penetration section of the board conductors 3, a clearance 9 where there is no conductor is provided. There is no conductor between the adjacent vias and between the via 4 and the board conductors 3. The adjacent vias are disposed side by side through the dielectric material 2. Further, the vias 4 and the board conductors 3 are disposed side by side through the dielectric material 2. Incidentally, it is desirable that the potential of the board conductor be at the ground (GND). However, the potential of the board conductor is not necessarily at the ground (GND) as long as the potential is fixed (The same holds for the embodiments described later). Moreover, the number of the board conductors 3 is four. However, the number of the board conductors 3 may be one or more. The number is appropriately determined according to frequency.

As shown in FIGS. 1 and 6, a land 5 is provided on the surface of the board and the land 5 is connected to the upper portion of the via. Outgoing lines 1 (which are first and second outgoing lines) of MSL are provided so that there is an electrical connection only for the outer vias (which are first and second vias) at both ends. As shown in FIG. 4, in the lower portions of the vias, there is an electrical connection between all the vias 4 and the ground layer 3 of the multilayer board. The ground layer 3 to which all the vias 4 are connected serves as a first fixed potential layer. Each of the ground layers 3 between the ground layer 3 serving as the first fixed potential layer and the outgoing lines 1 is a second fixed potential layer. The number of the vias is four in order to increase the Q value.

Figure 7:
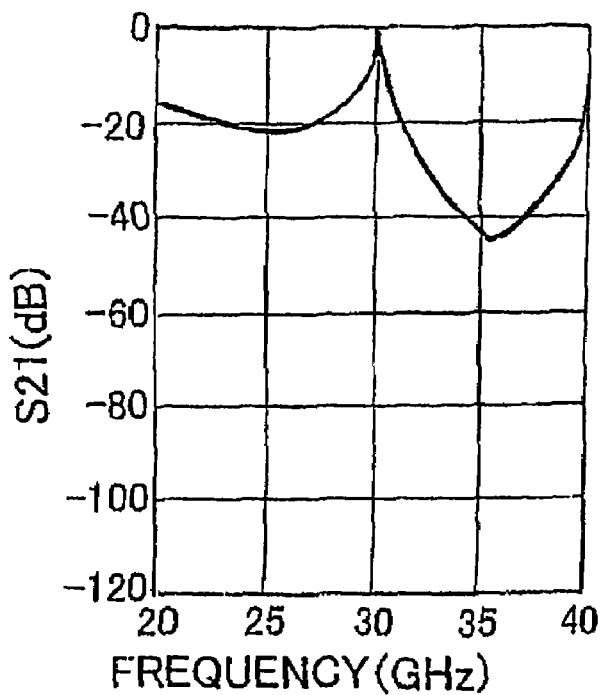
FIG. 7 is a characteristic chart showing a S21 characteristic according to electromagnetic field simulation of the filter circuit element of the first embodiment of the present invention.

The Q value represents inductance characteristics (acuteness of resonance). The higher Q value leads to a low-loss, highly efficient inductor. When the length of the vias is 1.2 mm and the relative permittivity of the dielectric material 2 is 4, one-fourth of the effective wavelength (which is $\lambda/(\sqrt{4})$, when the effective wavelength is represented as $\lambda/\sqrt{\in}$) is "the length of the vias" 1.2 mm, the wavelength $\lambda$ is 9.6 mm, and the frequency is at 31 GHz then. FIG. 7 shows a S21 characteristic (S-parameter characteristic) according to electromagnetic field simulation. Here, an S-parameter is one of the circuit network parameters used to represent the characteristics of high-frequency electronic circuits or high-frequency electronic components, and also referred to as a scattering matrix (S-matrix) or a scattering parameter. In FIG. 7, the band path filter (BPF) characteristic of 30 GHz is obtained.

According to the present embodiment, the diameter of the land 5 is 0.45 mm, the diameter of the vias is 0.25 mm, the diameter of an area consisting of one via and the surrounding clearance is 0.7 mm (the radius of the area consisting of one via and the surrounding clearance is represented by L in FIG. 3), the distance between the centers of the vias is 0.6 mm, and the impedance of the microstrip lines (MSLs) is 50Ω.

Figure 56:
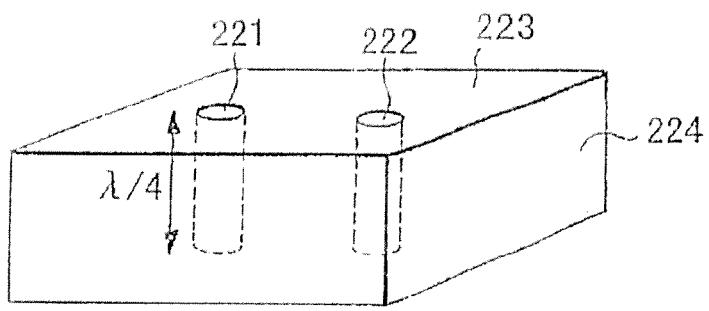
FIG. 56 is a diagram illustrating an example of the formation of a three-dimensional BPF by forming lines in high dielectric ceramics.
Figure 57A:
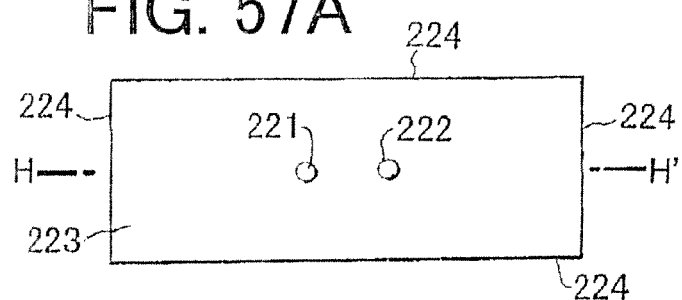
FIG. 57 is a diagram illustrating an example of the formation of a three-dimensional BPF by forming lines in high dielectric ceramics.
Figure 57B:
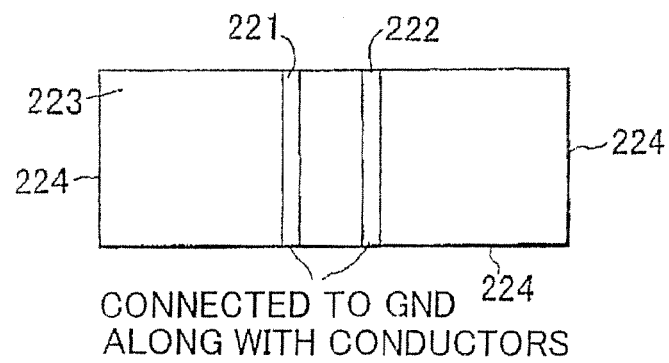

According to the present embodiment which is different from the background art illustrated in FIGS. 56 and 57, the vias are not covered with the boxy GND 224. Instead a plurality of the GND layers 3 is provided. Thanks to the configuration, it is possible to form the BPF on the multilayer board without a new boxy GND 224 and without increasing the number of production processes for the multilayer board. Thanks to a plurality of the ground layers 3, it is easy to control the impedance and effective permittivity of the via sections and to design the filter.

Second Embodiment

Figure 8:
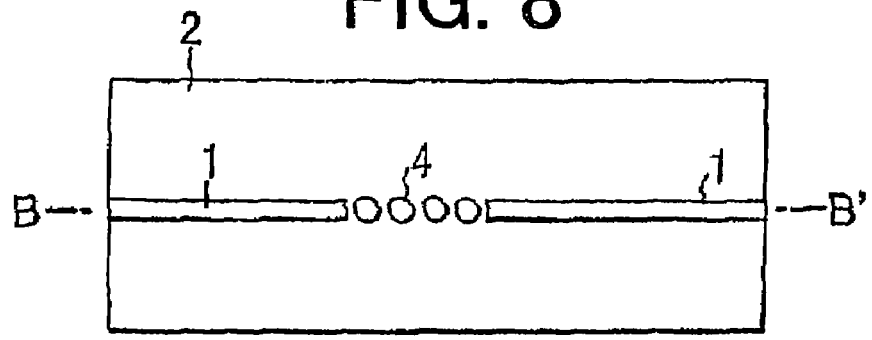
FIG. 8 is a top view of a filter circuit element according to a second embodiment of the present invention.
Figure 9:
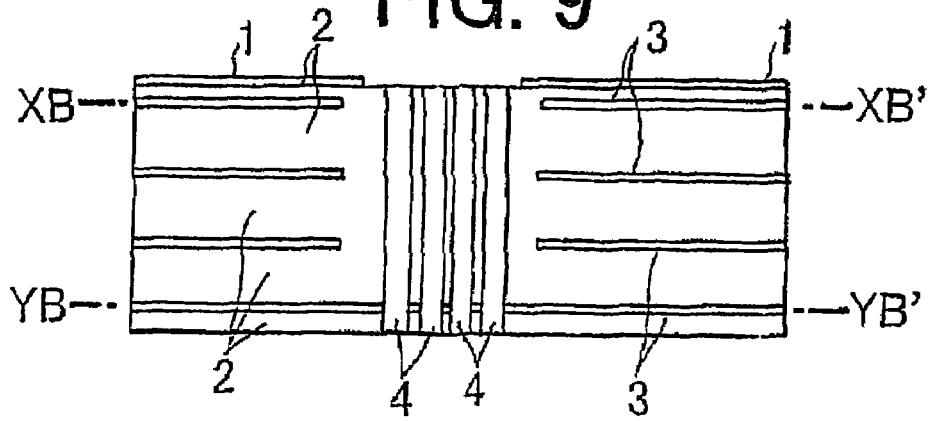
FIG. 9 is a vertical cross-sectional view of FIG. 8 taken along the line B-B'.
Figure 10:
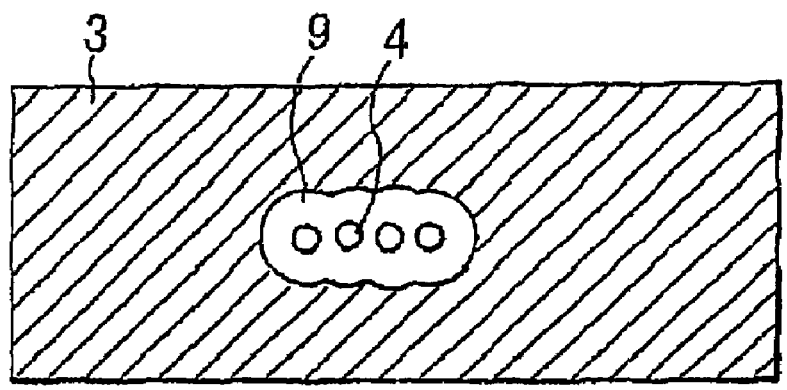
FIG. 10 is a lateral cross-sectional view of FIG. 9 taken along the line XB-XB'.
Figure 11:
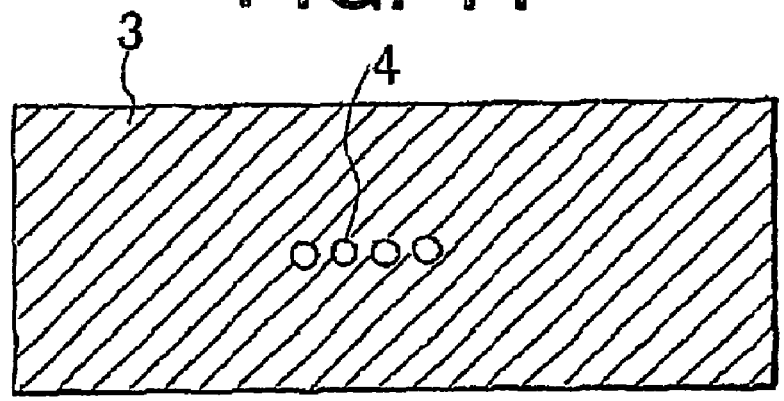
FIG. 11 is a lateral cross-sectional view of FIG. 9 taken along the line YB-YB'.
Figure 12:
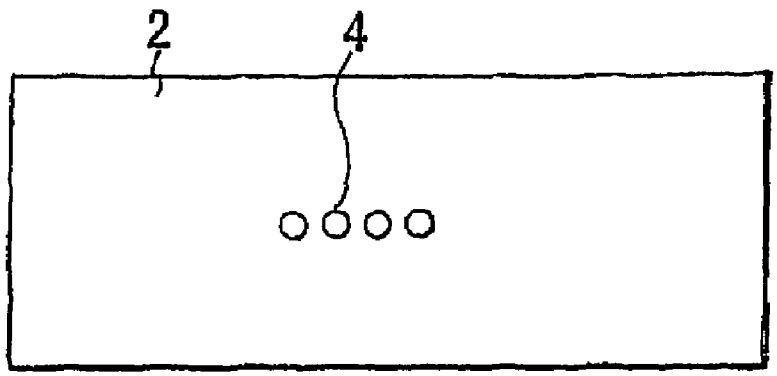
FIG. 12 is a bottom view of the filter circuit element according to the second embodiment of the present invention.

FIGS. 8 to 12 are diagrams illustrating the configuration of a filter circuit element according to a second embodiment of the present invention. FIG. 8 is a top view of the filter circuit element. FIG. 9 is a vertical cross-sectional view of FIG. 8 taken along the line B-B'. FIG. 10 is a lateral cross-sectional view of FIG. 9 taken along the line XB-XB'. FIG. 11 is a lateral cross-sectional view of FIG. 9 taken along the line YB-YB'. FIG. 12 is a bottom view of the filter circuit element. In FIGS. 8 to 12, the same structural members as those of FIGS. 1 to 7 have been designated by the same reference numerals, and each structural member will not be described here.

Figure 13:
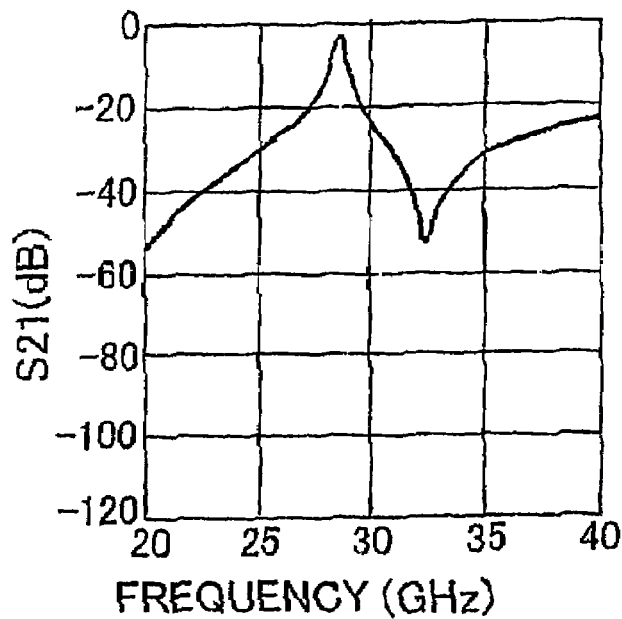
FIG. 13 is a characteristic chart showing a S21 characteristic according to electromagnetic field simulation of the second embodiment of the present invention.

In the first embodiment, since there is a land, an area where the land is provided is necessary. However, according to the present embodiment, the land is removed to make the filter circuit element compact. The distance between the centers of the vias is 0.6 mm in the first embodiment, whereas the distance between the centers of the vias is 0.3 mm in the present embodiment. FIG. 13 shows a S21 characteristic (S-parameter characteristic) according to electromagnetic field simulation.

In order to provide an electrical connection for the vias at both ends by connecting the vias to the outgoing lines 1, the land is necessary in terms of production processes. According to the present embodiment, the vias are capacity-coupled with the outgoing lines 1 to remove the lands. In the present application, "electrically connected" includes such a "capacity coupled." Since the BPF can be formed while the rate of occupied area is made small, the configuration is favorable for high-density packaging.

Third Embodiment

Figure 14:
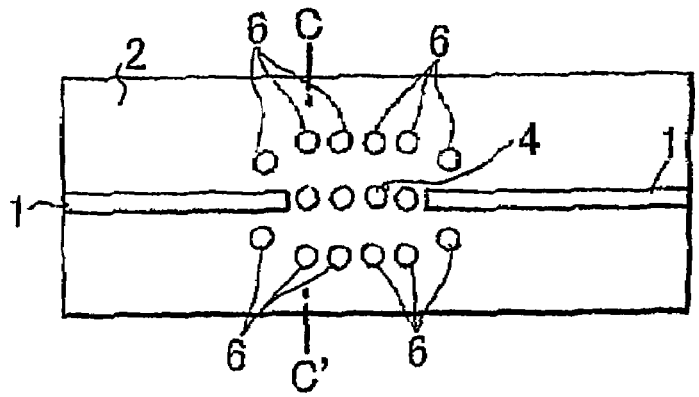
FIG. 14 is a top view of a filter circuit element according to a third embodiment of the present invention.
Figure 15:
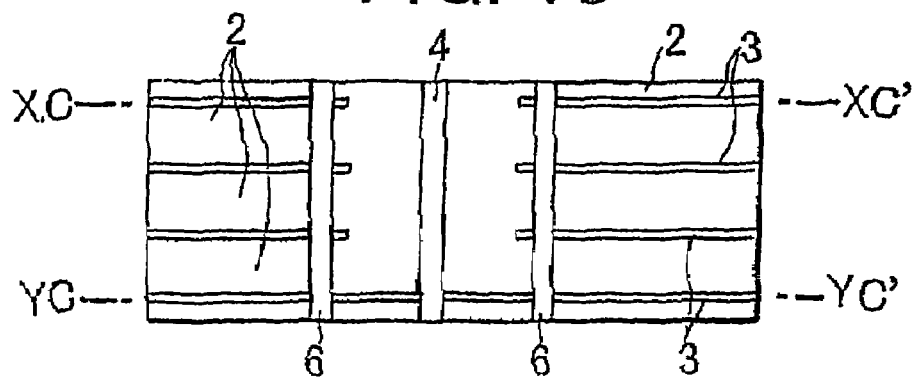
FIG. 15 is a vertical cross-sectional view of FIG. 14 taken along the line C-C'.
Figure 16:
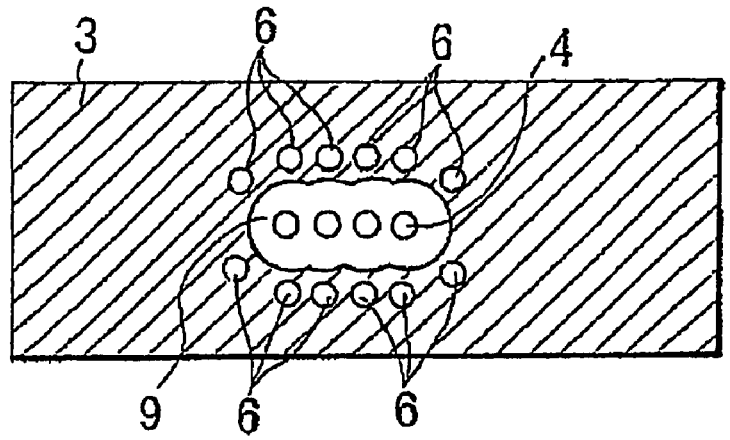
FIG. 16 is a lateral cross-sectional view of FIG. 15 taken along the line XC-XC'.
Figure 17:
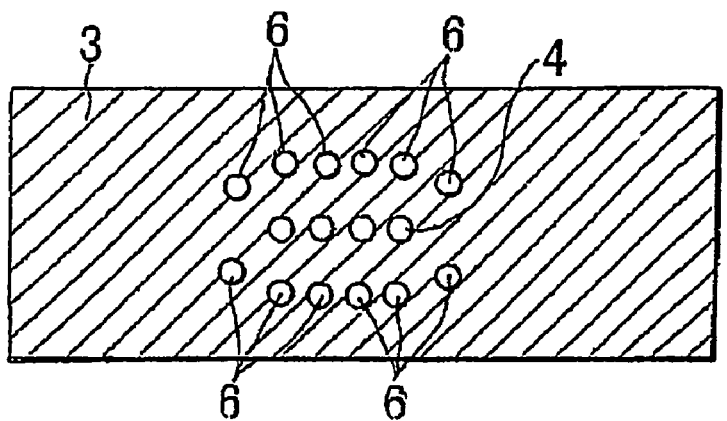
FIG. 17 is a lateral cross-sectional view of FIG. 15 taken along the line YC-YC'.
Figure 18:
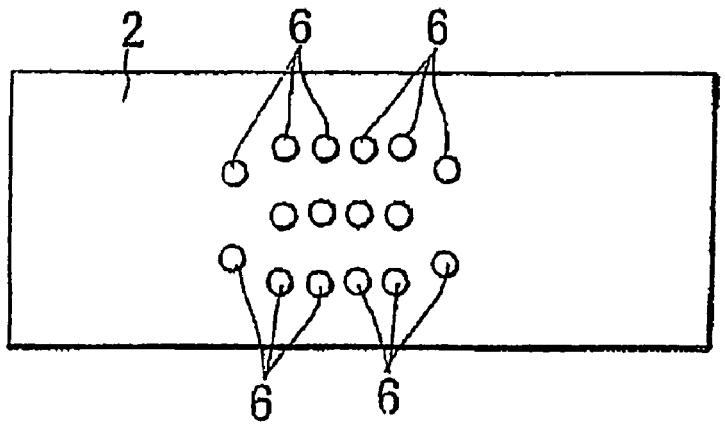
FIG. 18 is a bottom view of the filter circuit element according to the third embodiment of the present invention.

FIGS. 14 to 18 are diagrams illustrating the configuration of a filter circuit element according to a third embodiment of the present invention. FIG. 14 is a top view of the filter circuit element. FIG. 15 is a vertical cross-sectional view of FIG. 14 taken along the line C-C'. FIG. 16 is a lateral cross-sectional view of FIG. 15 taken along the line XC-XC'. FIG. 17 is a lateral cross-sectional view of FIG. 15 taken along the line YC-YC'. FIG. 18 is a bottom view of the filter circuit element. In FIGS. 14 to 18, the same structural members as those of FIGS. 8 to 12 have been designated by the same reference numerals, and each structural member will not be described here. The configuration of the present embodiment is the same as that of the second embodiment except that ground vias 6 are provided.

Figure 19:
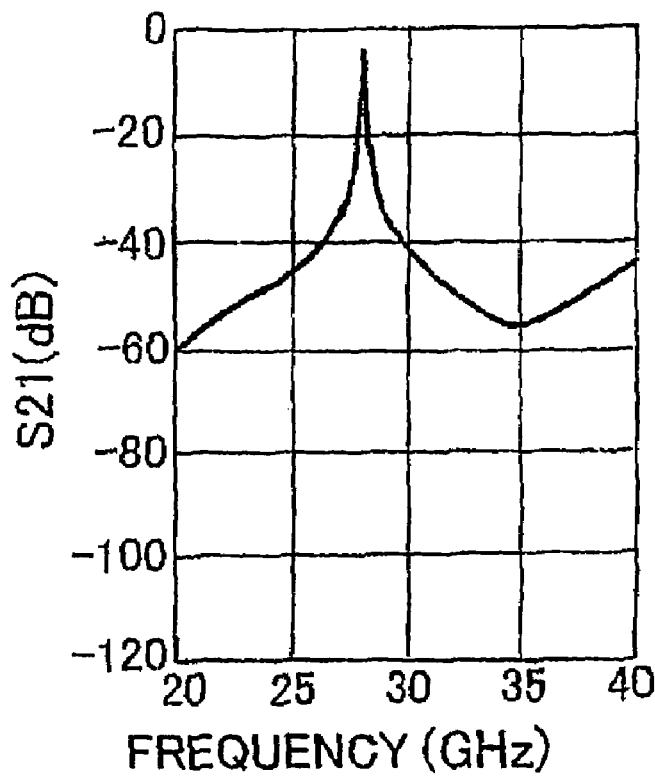
FIG. 19 is a characteristic chart showing a S21 characteristic according to electromagnetic field simulation of the third embodiment of the present invention.

There is capacity coupling in the BPF section, and there may be a lot of radiation. According to the present embodiment, the ground vias 6 are so provided as to surround the vias 4 and the end portions of the outgoing lines 1 for shielding. Moreover, since there are the ground vias 6, a return path is provided next to the vias 4, a reduction in the current loop area arising from a return path that goes a long way through the ground layers 3 of the multilayer board is led. The reduction in the current loop area may also help reduce radiation noise. FIG. 19 shows a S21 characteristic (S-parameter characteristic) according to electromagnetic field simulation. As shown in FIG. 19, it is clear that the Q value has improved in terms of characteristics.

Fourth Embodiment

Figure 20:
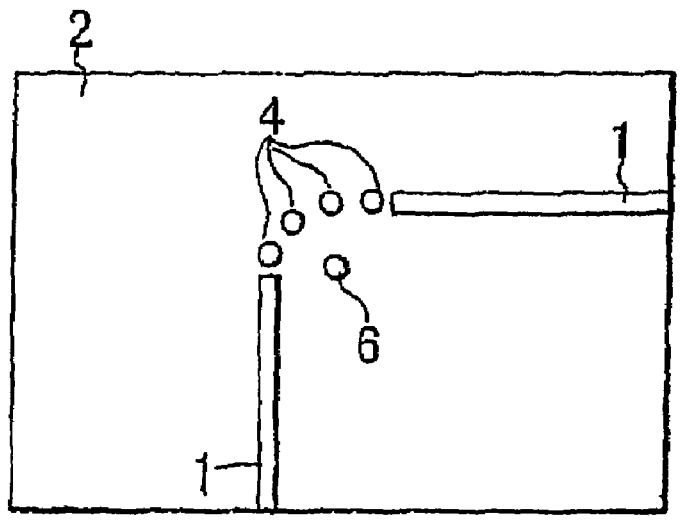
FIG. 20 is a top view of a filter circuit element according to a fourth embodiment of the present invention.
Figure 21:
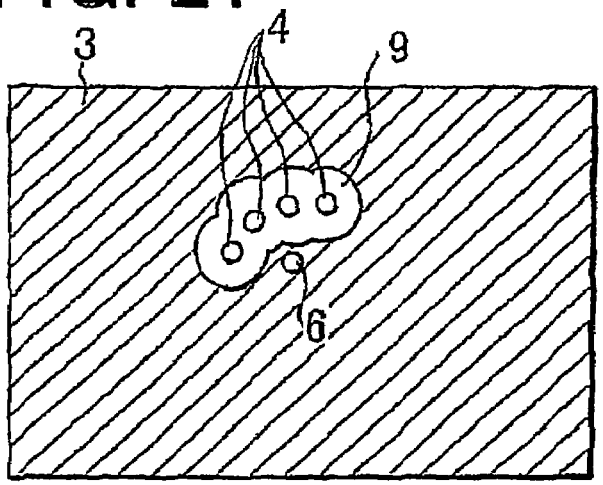
FIG. 21 is a cross-sectional view corresponding to the lateral cross-section of FIG. 15 taken along the line XC-XC'.
Figure 22:
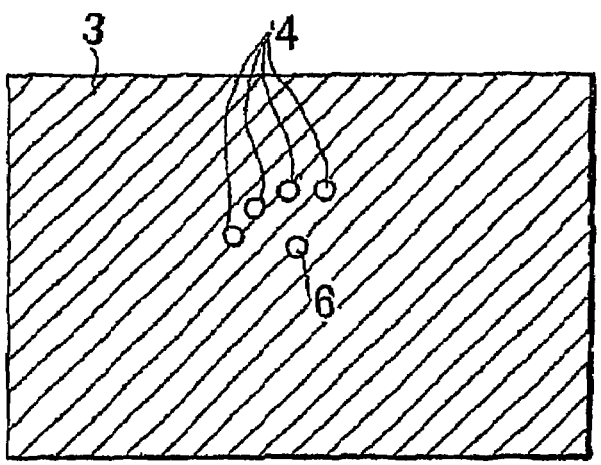
FIG. 22 is a cross-sectional view corresponding to the lateral cross-section of FIG. 15 taken along the line YC-XC'.
Figure 23:
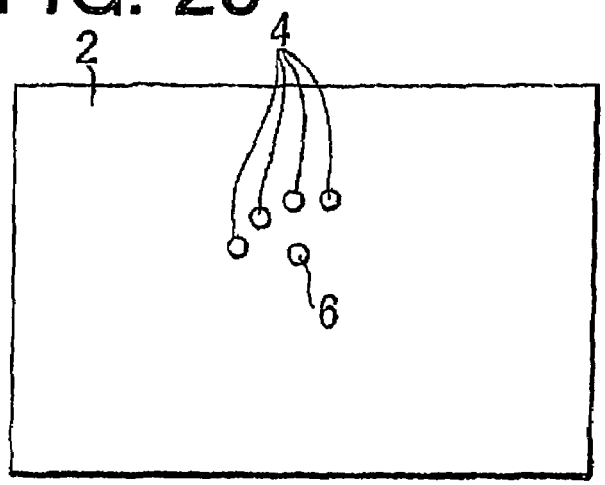
FIG. 23 is a bottom view of the filter circuit element according to the fourth embodiment of the present invention.

FIGS. 20 to 23 are diagrams illustrating the configuration of a filter circuit element according to a fourth embodiment of the present invention. FIG. 20 is a top view of the filter circuit element. FIGS. 21 and 22 are lateral cross-sectional views, one corresponding to the lateral cross-section of FIG. 15 taken along the line XC-XC' and the other corresponding to the lateral cross-sectional view of FIG. 15 taken along the line YC-YC'. FIG. 23 is a bottom view of the filter circuit element. In FIGS. 20 to 23, the same structural members as those of FIGS. 14 to 18 have been designated by the same reference numerals, and each structural member will not be described here.

According to the present embodiment, like the third embodiment, the ground vias 6 are provided for the return path. Moreover, as shown in FIG. 20, two outgoing lines 1 are so disposed as to form a right angle through a row of vias 4. In this case, as shown in FIG. 20, the vias 4 for the BPF are so disposed as to form a circular arc and the ground via 6 is disposed at a position which is the center of the circular arc. Therefore, one ground via 6 can adjust the characteristics of each via for the BPF, and the return path is also provided.

It is not necessary to dispose two outgoing lines 1 so that the outgoing lines 1 form a right angle. The angel formed by two outgoing lines 1 may be set at an arbitrary angle between 0 degree (two outgoing lines 1 are parallel to each other) and a right angle.

Fifth Embodiment

Figure 24:
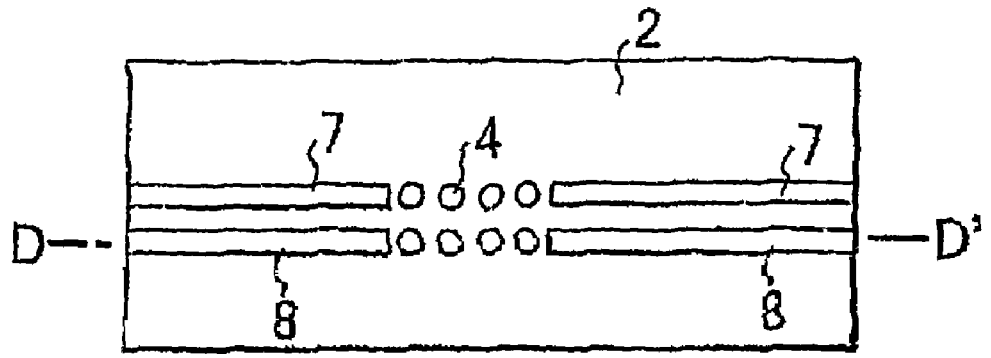
FIG. 24 is a top view of a filter circuit element according to a fifth embodiment of the present invention.
Figure 25:
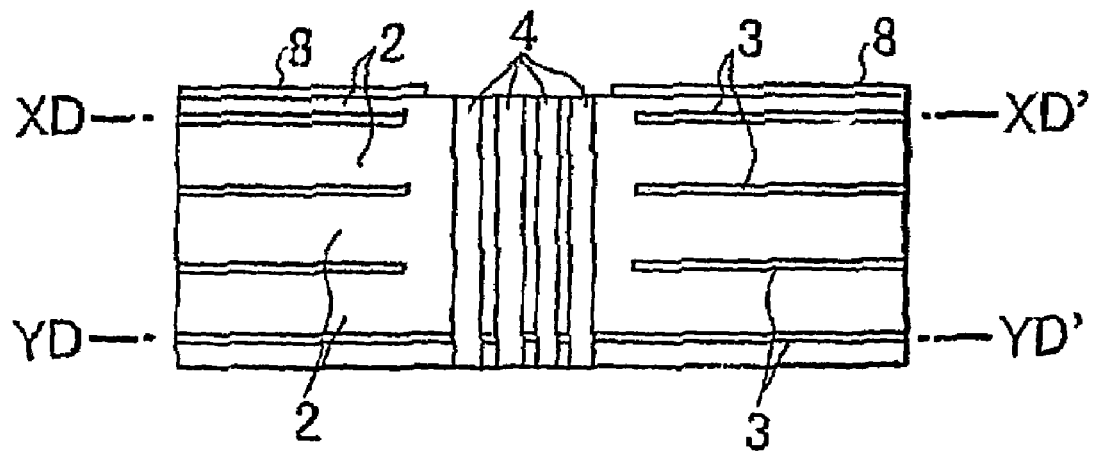
FIG. 25 is a vertical cross-sectional view of FIG. 24 taken along the line D-D'.
Figure 26:
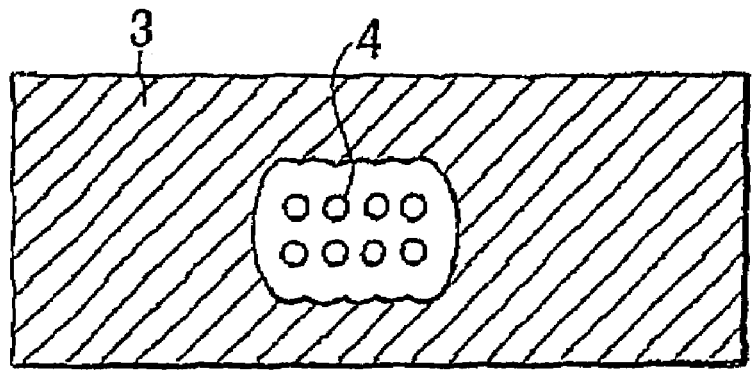
FIG. 26 is a lateral cross-sectional view of FIG. 25 taken along the line XD-XD'.
Figure 27:
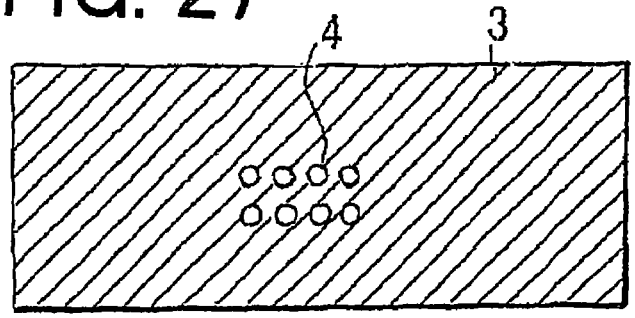
FIG. 27 is a lateral cross-sectional view of FIG. 25 taken along the line YD-YD'.
Figure 28:
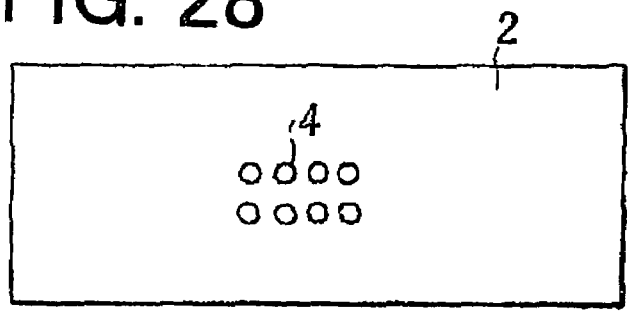
FIG. 28 is a bottom view of the filter circuit element according to the fifth embodiment of the present invention.
Figure 29:
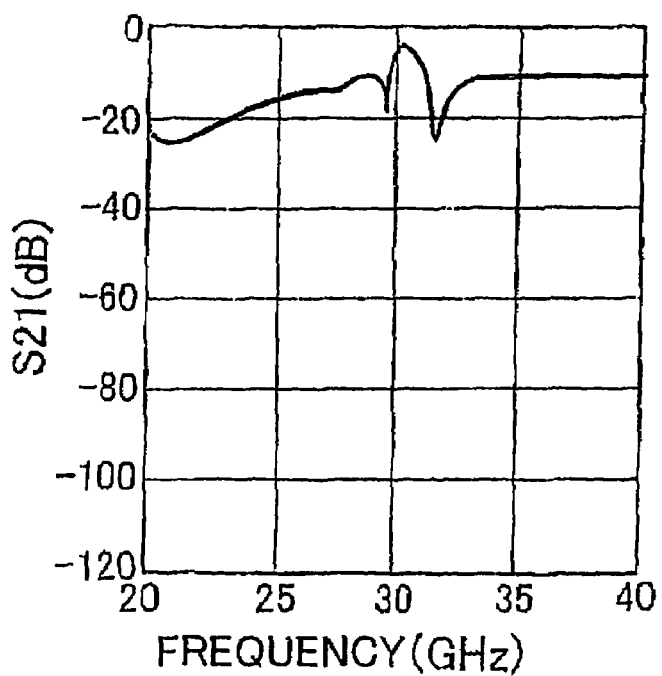
FIG. 29 is a characteristic chart showing a S21 characteristic according to electromagnetic field simulation of the fifth embodiment of the present invention.

FIGS. 24 to 28 are diagrams illustrating the configuration of a filter circuit element according to a fifth embodiment of the present invention. FIG. 24 is a top view of the filter circuit element. FIG. 25 is a vertical cross-sectional view of FIG. 24 taken along the line D-D'. FIG. 26 is a lateral cross-sectional view of FIG. 25 taken along the line XD-XD'. FIG. 27 is a lateral cross-sectional view of FIG. 25 taken along the line YD-YD'. FIG. 28 is a bottom view of the filter circuit element. In FIGS. 24 to 28, the same structural members as those of FIGS. 8 to 12 have been designated by the same reference numerals, and each structural member will not be described here. According to the present embodiment, two filter circuit elements of the second embodiment are provided parallel to each other to form differential lines. FIG. 29 shows a S21 characteristic (S-parameter characteristic) according to electromagnetic field simulation.

Sixth Embodiment

Figure 30:
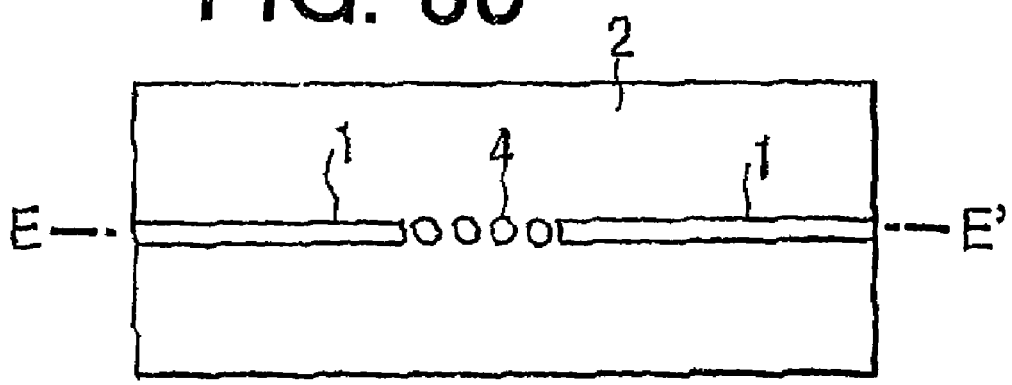
FIG. 30 is a top view of a filter circuit element according to a sixth embodiment of the present invention.
Figure 31:
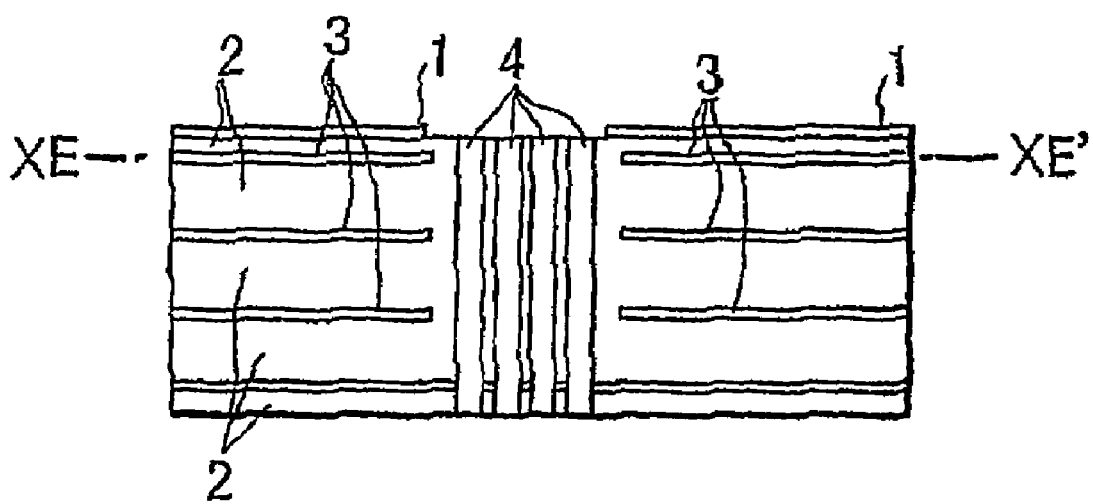
FIG. 31 is a vertical cross-sectional view of FIG. 30 taken along the line E-E'.
Figure 32:
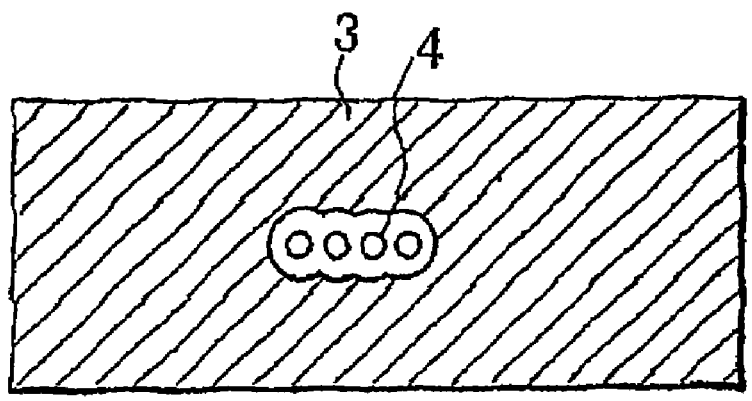
FIG. 32 is a lateral cross-sectional view of FIG. 31 taken along the line XE-XE'.

FIGS. 30 to 32 are diagrams illustrating the configuration of a filter circuit element according to a sixth embodiment of the present invention. FIG. 30 is a top view of the filter circuit element. FIG. 31 is a vertical cross-sectional view of FIG. 24 taken along the line E-E'. FIG. 32 is a lateral cross-sectional view of FIG. 31 taken along the line XE-XE'. In FIGS. 30 to 32, the same structural members as those of FIGS. 8 to 12 have been designated by the same reference numerals, and each structural member will not be described here.

According to the present embodiment, the width of the clearance 9 of the second embodiment has been changed to change the resonance frequency. The configuration of the present embodiment is the same as that of the second embodiment except that the width of the clearance 9 is different.

Like the present embodiment, a change in the distance between the via 4 and the ground layer 3 (the width of the clearance 9) leads to a change in the effective relative permittivity, resulting in a change in the resonance frequency. Here, if the inductance and capacitance of the via 4 are represented by L and C, respectively, the resonance frequency is represented by $1/(2\pi\sqrt{(L \cdot C)})$. Therefore, when the distance between the via 4 and the ground 3 for example increases, C decreases while L remains almost unchanged, thereby leading to an increase in the resonance frequency. Accordingly, by appropriately changing when the distance between the via 4 and the ground 3, the resonance frequency can be changed.

Seventh Embodiment

Figure 33:
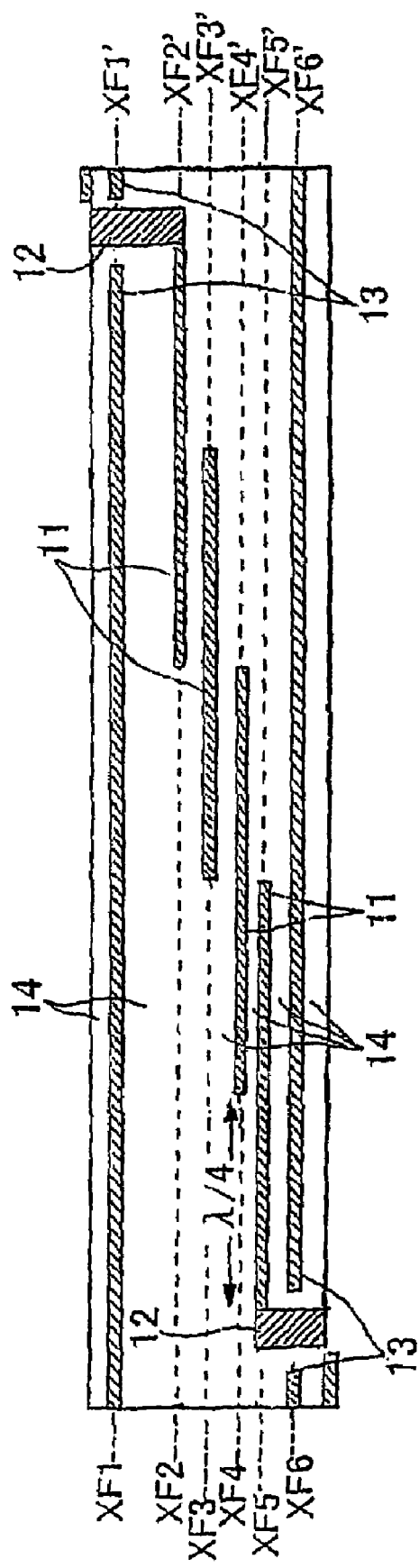
FIG. 33 is a cross-sectional view of a filter circuit element according to a seventh embodiment of the present invention.
Figure 34:
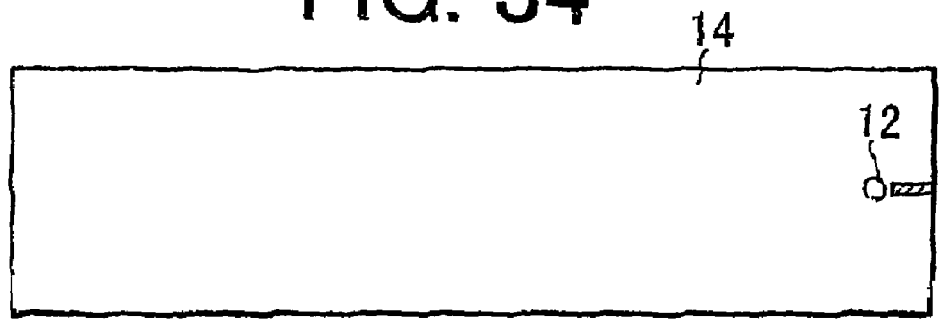
FIG. 34 is a top view of the filter circuit element according to the seventh embodiment of the present invention.
Figure 40:
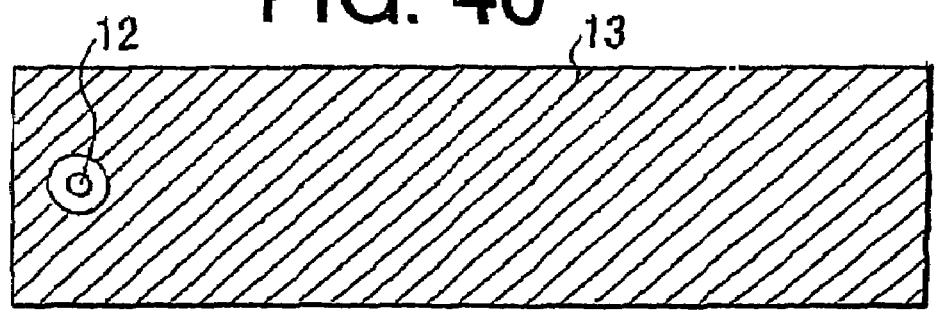
FIG. 40 is a lateral cross-sectional view of FIG. 33 taken along the line XF6 to XF6'.
Figure 41:
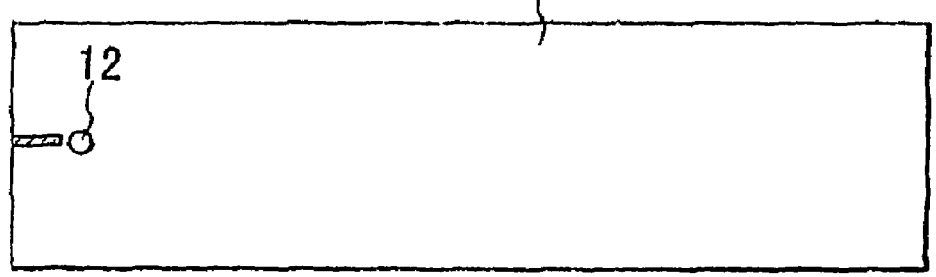
FIG. 41 is a bottom view of a filter circuit element according to a seventh embodiment of the present invention.

FIGS. 33 to 41 are diagrams illustrating the configuration of a filter circuit element according to a seventh embodiment of the present invention. FIG. 33 is a cross-sectional view of the filter circuit element. FIG. 34 is a top view of the filter circuit element. FIGS. 35 to 40 are lateral cross-sectional views of FIG. 33 taken along the lines XF1 to XF1' to XF6 to XF6'. FIG. 41 is a bottom view of the filter circuit element.

Figure 35:
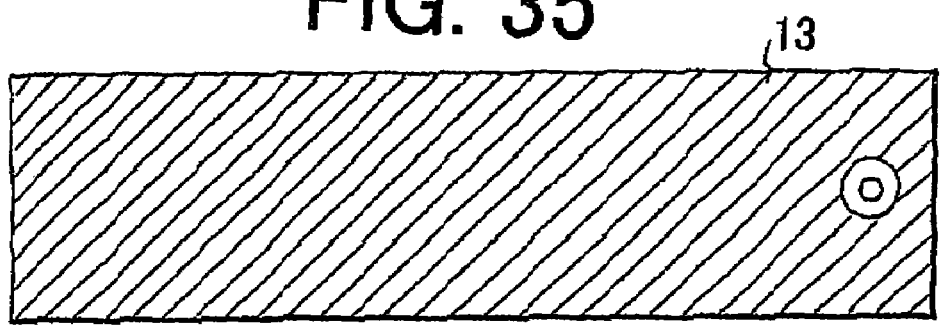
FIG. 35 is a lateral cross-sectional view of FIG. 33 taken along the line XF1 to XF1'.
Figure 36:
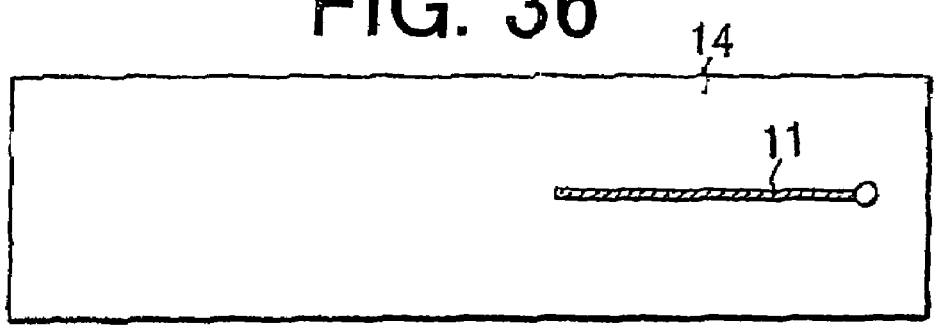
FIG. 36 is a lateral cross-sectional view of FIG. 33 taken along the line XF2 to XF2'.
Figure 37:
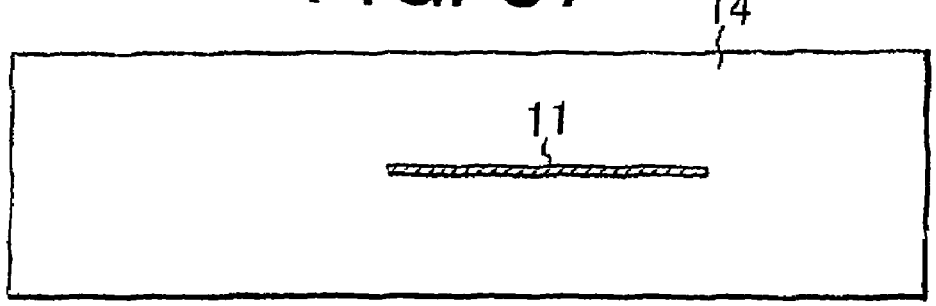
FIG. 37 is a lateral cross-sectional view of FIG. 33 taken along the line XF3 to XF3'.
Figure 38:
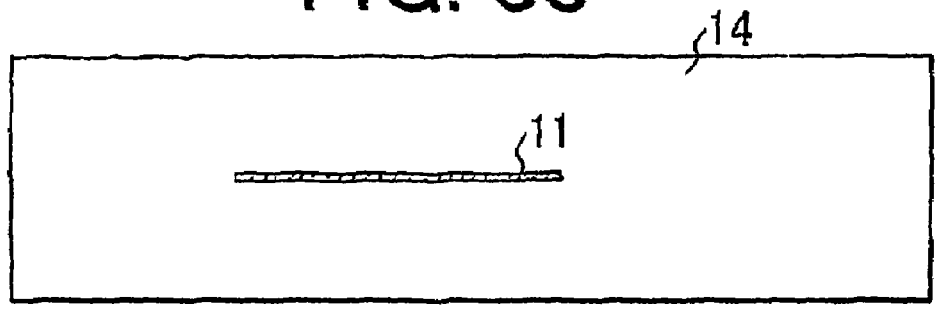
FIG. 38 is a lateral cross-sectional view of FIG. 33 taken along the line XF4 to XF4'.
Figure 39:
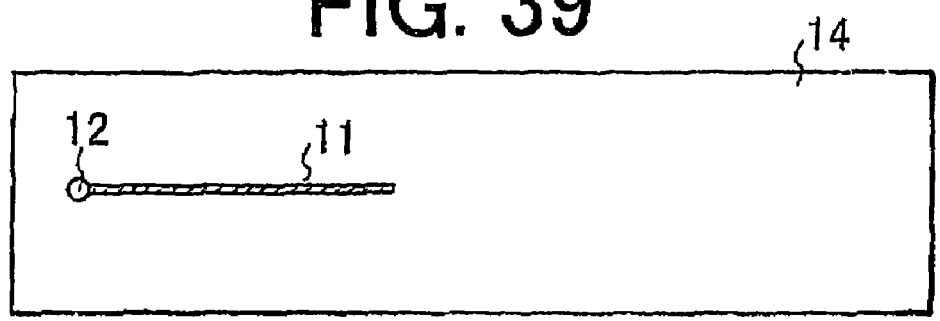
FIG. 39 is a lateral cross-sectional view of FIG. 33 taken along the line XF5 to XF5'.

According to the present embodiment, as shown in FIGS. 33 and 36 to 39, each line 11 with the length of $\lambda/2$ is shifted by $\lambda/4$ from the a neighboring line and formed on each of the inner layers of the multilayer board. Therefore, a planar MSL-type BPF is formed in a three-dimensional way. The BPF is formed while the rate of occupied area is made low. As shown in FIGS. 33, 35 and 40, the ground layers 13 are formed on the upper and lower layers of the inner line group 11, thereby preventing radiation noise from leaking outside.

An input section and an output section are formed with the use of a via 12 that pierces through the ground layer 13. Incidentally, there may be no ground layer 13. Moreover, there may be no ground layer 13 and no via 12, and each of the input/output sections may be formed by capacity coupling with the line 11 formed on the surface layer. Moreover, the wiring may be a coplanar type.

Incidentally, $\lambda$ represents the effective wavelength which is obtained by dividing the wavelength corresponding to a target signal frequency by the square root of the relative permittivity of the medium, and is referred to as a target effective wavelength in the present application.

Eighth Embodiment

Figure 42:
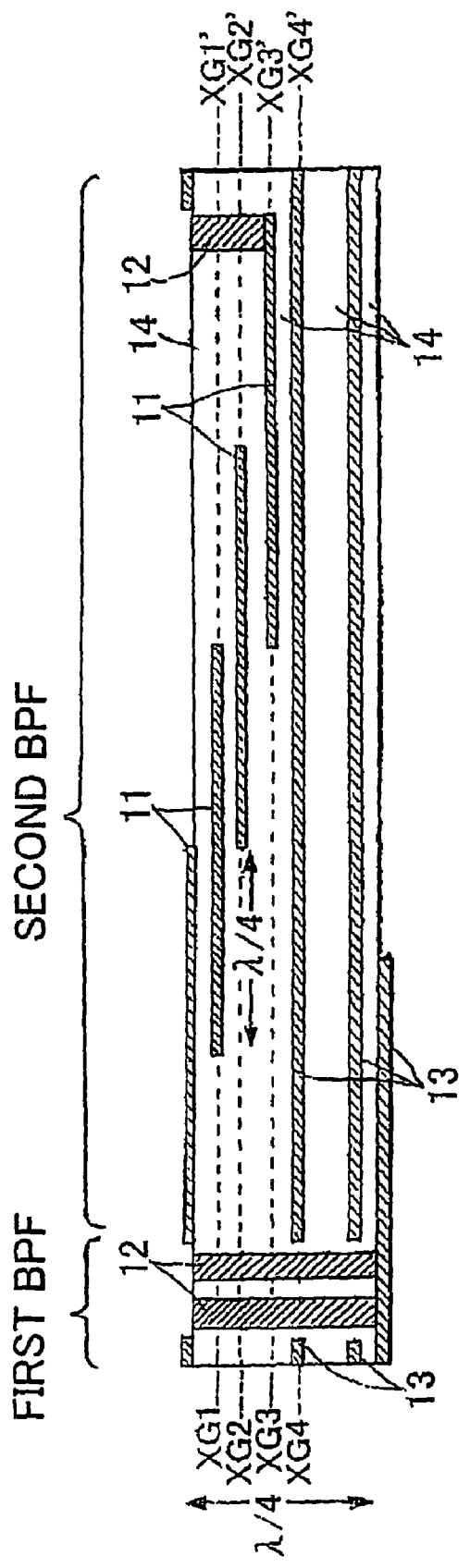
FIG. 42 is a cross-sectional view of a filter circuit element according to an eighth embodiment of the present invention.
Figure 43:
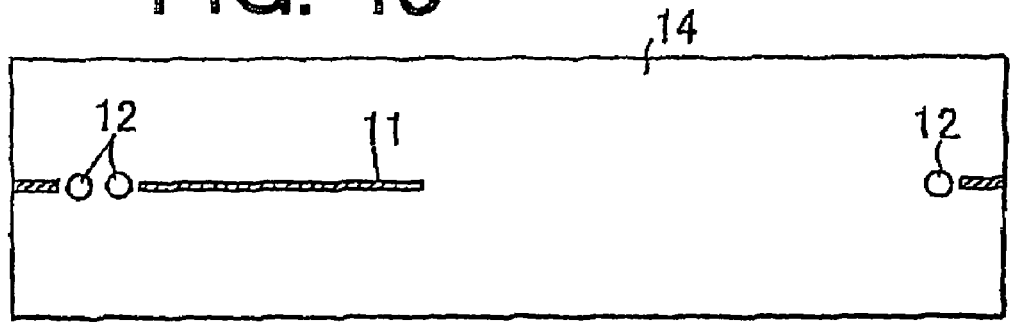
FIG. 43 is a top view of the filter circuit element according to the eighth embodiment of the present invention.
Figure 44:
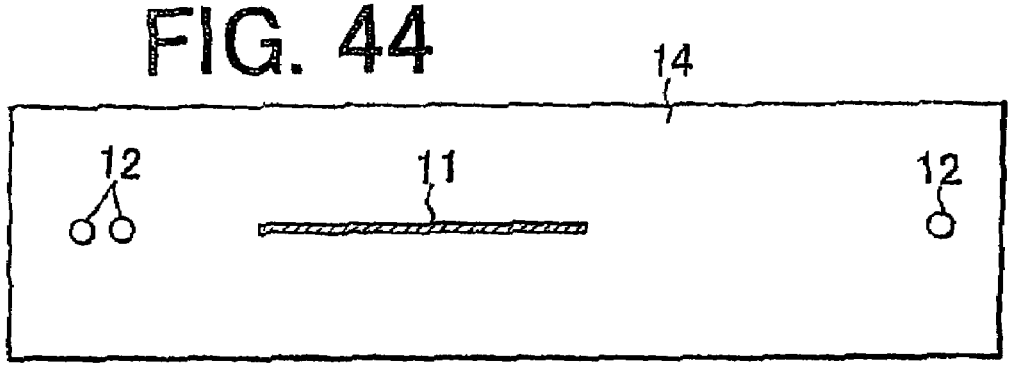
FIG. 44 is a lateral cross-sectional view of FIG. 42 taken along the line XG1 to XG1'.
Figure 45:
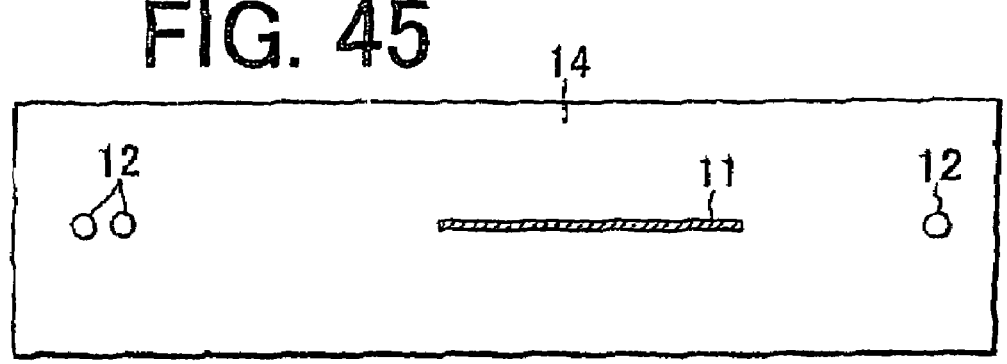
FIG. 45 is a lateral cross-sectional view of FIG. 42 taken along the line XG2 to XG2'.
Figure 46:
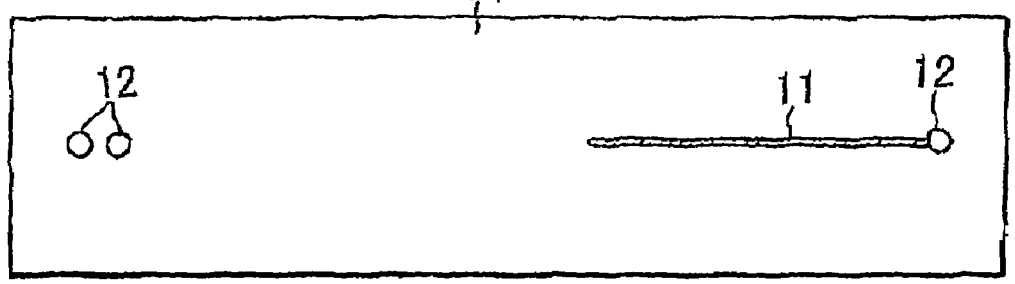
FIG. 46 is a lateral cross-sectional view of FIG. 42 taken along the line XG3 to XG3'.
Figure 47:
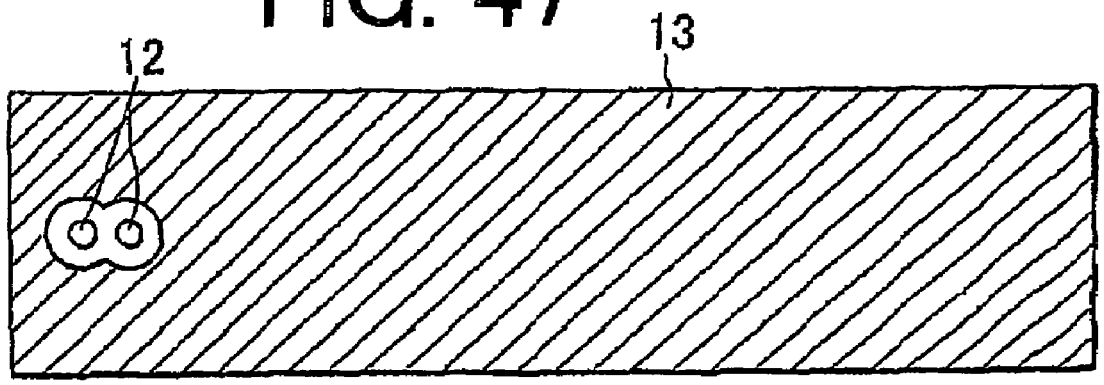
FIG. 47 is a lateral cross-sectional view of FIG. 42 taken along the line XG4 to XG4'.
Figure 48:
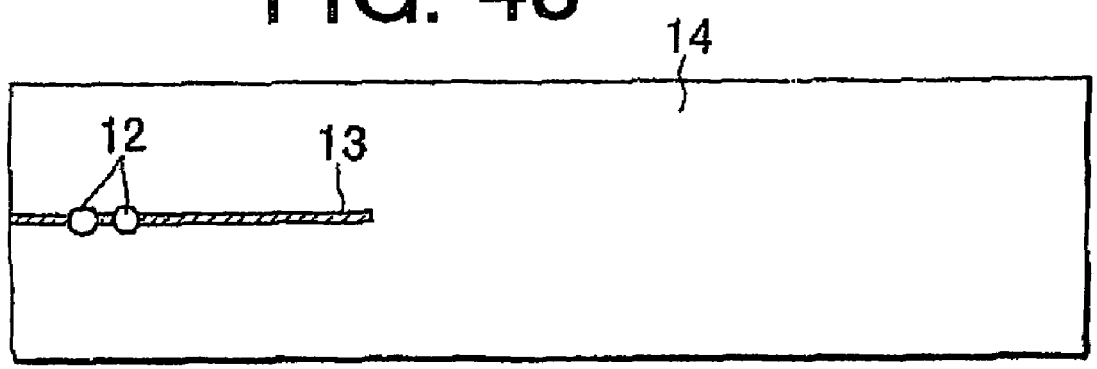
FIG. 48 is a bottom view of the filter circuit element according to the eighth embodiment of the present invention.

FIGS. 42 to 48 are diagrams illustrating the configuration of a filter circuit element according to an eighth embodiment of the present invention. FIG. 42 is a cross-sectional view of the filter circuit element. FIG. 43 is a top view of the filter circuit element. FIGS. 44 to 47 are lateral cross-sectional views of FIG. 42 taken along the lines XG1 to XG1' to XG4 to XG4'. FIG. 48 is a bottom view of the filter circuit element.

A second BPF is formed by a combination of a first BPF (which becomes a first filter formation element), which has two vias and makes use of the vias of the second embodiment, and the BPF of the seventh embodiment (which becomes a second filter formation element). According to the present embodiment, the via that becomes one input/output section (on the right side of the diagram) is formed by capacity coupling with the line of the surface layer, and is connected to the line 11 on one end portion. In the other input/output section (on the left side of the diagram), the line of the surface layer is connected to one of two through vias by capacity coupling, and the other through via is capacity-coupled with the line 11 at the other end portion. The ground layers 13 are formed only on the lower side. Since the BPF is formed by a combination of the BPF which makes use of the vias of the second embodiment and the BPF of the seventh embodiment, an unused space, as well as the structure of the lines, can be effectively used in forming the BPF.

Incidentally, according to the present embodiment, the seventh embodiment is combined with the second embodiment. However, the seventh embodiment may be combined with any of the second to sixth embodiments.

Ninth Embodiment

Figure 49:
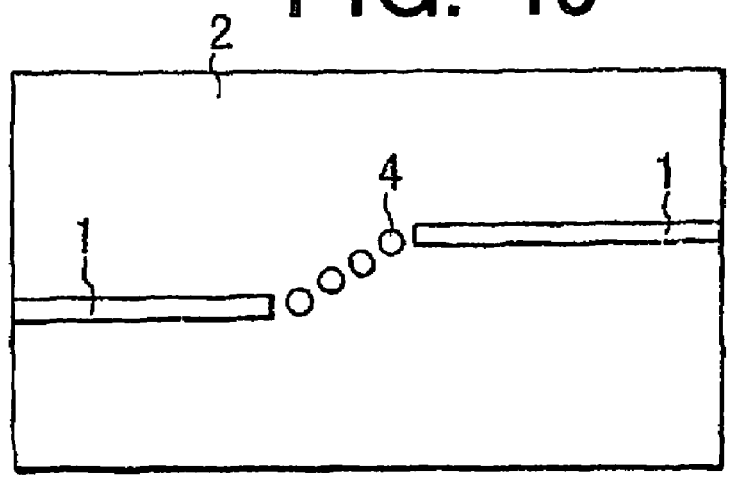
FIG. 49 is a top view of a filter circuit element according to a ninth embodiment of the present invention.
Figure 50:
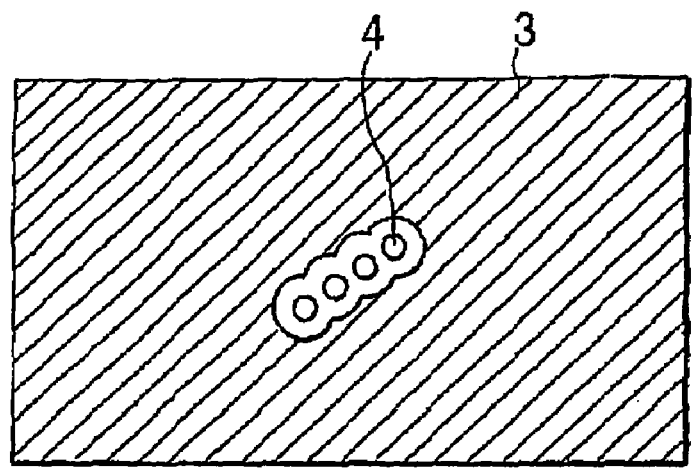
FIG. 50 is a cross-sectional view corresponding to the lateral cross-sectional view of FIG. 2 taken along the line XB to XB'.

FIGS. 49 to 50 are diagrams illustrating the configuration of a filter circuit element according to a ninth embodiment of the present invention. FIG. 49 is a top view of the filter circuit element. FIG. 50 is a cross-sectional view corresponding to a lateral cross-sectional view of FIG. 2 taken along the line XB to XB'. The configuration of the present embodiment is based on the configuration of the second embodiment; two outgoing lines 1 are disposed such that one outgoing line 1 becomes shifted from the other outgoing line 1 in a direction perpendicular to the direction of the length. As shown in FIG. 49, a row of vias 4 is tilted at a predetermined angle in the direction of the length of the outgoing line 1 so that the row of the vias 4 is capacity-coupled with the end portions of the outgoing lines 1. The configuration of the element is the same as that of FIGS. 8 to 12 except that two outgoing lines 1 are disposed such that one outgoing line 1 becomes shifted from the other outgoing line 1 in a direction perpendicular to the direction of the length.

Tenth Embodiment

Figure 51:
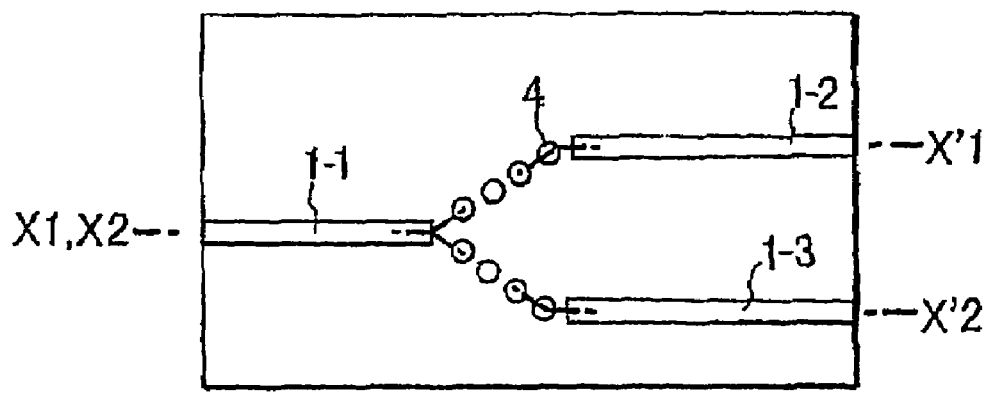
FIG. 51 is a top view of a filter circuit element according to a tenth embodiment of the present invention.
Figure 52:
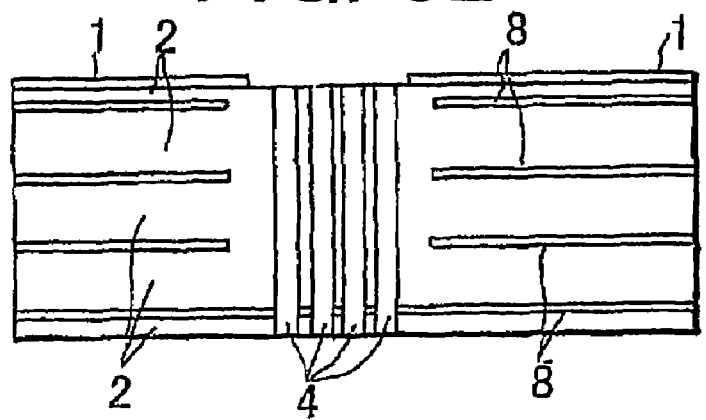
FIG. 52 is a vertical cross-sectional view of FIG. 51 taken along the line X1 to X1'.

FIGS. 51 to 53 are diagrams illustrating the configuration of a filter circuit element according to a tenth embodiment of the present invention. FIG. 51 is a top view of the filter circuit element. FIG. 52 is a vertical cross-sectional view of FIG. 51 taken along the line X1 to X1'. FIG. 52 is a vertical cross-sectional view of FIG. 51 taken along the line X2-X2'.

According to the present embodiment, a signal communication path between an outgoing line 1-1 and an outgoing line 1-2 and a signal communication path between the outgoing line 1-1 and an outgoing line 1-3 are provided. Moreover, the length of the vias 4 reaching to the ground as shown in FIG. 52 and the length of the vias 4 reaching to the ground as shown in FIG. 53 have been changed. That is, according to the present embodiment, frequency characteristics vary between the signal communication path between the outgoing line 1-1 and the outgoing line 1-2 and a signal communication path between the outgoing line 1-1 and the outgoing line 1-3.

Moreover, the input section may be capacity-coupled by a blind via, and the vias 4 may be inductively coupled with each other. The outgoing lines 1 may be strip lines.

Moreover, the present invention is not limited to the BPF using a short stub. The present invention may be applied to a BPF or BEF (Band Elimination Filter) using an open stub or a short stub.

Moreover, in each of the above-noted embodiments, the vias are through vias. However, the vias may be IVH (Interstitial Via Hole) which connects the conductive layers inside the multilayer board, the outgoing lines may not be provided on the surface, and the conductive layers inside the multilayer board may serve as the outgoing lines. Moreover, in each of the above-noted embodiments, the bottom ground layer is provided inside the multilayer board. However, the back surface of the multilayer board may serve as the ground layer. Moreover, the outgoing line is provided on the surface of the multilayer board. However, the outgoing line may be provided as the inner layer of the multilayer board.

Eleventh Embodiment

FIG. 54 is a diagram illustrating the configuration of an electronic circuit device according to an embodiment of the present invention. The electronic circuit device shown in FIG. 54 causes clock signals supplied from a signal generation circuit 15, which outputs the clock signals, to pass through a BPF 14, which is one of the filter circuit elements of the above-described embodiments, and then supplies the clock signals to an electronic device 16. The electronic circuit device can supply to the electronic device 16 the clock signals having a narrow range of frequency components and a small amount of jitter.

The above has described the representative embodiments of the present invention. However, the present invention may be embodied in other various forms without departing from the spirit or essential characteristics thereof as defined by the appended claims. The described embodiments are, therefore, to be considered only as illustrative and not restrictive. The scope of the present invention is indicated by the appended claims, and not restricted by the foregoing description and the abstract. All modifications and alterations which come within the meaning and range of equivalency of the claims are to be embraced within the scope of the present invention.

INDUSTRIAL APPLICABILITY

The present invention can be used in a filter circuit element formed on a multilayer board, and the filter circuit element can be used particularly in an electronic circuit device that supplies clock signals to an electronic device.

The invention claimed is:

1. A filter circuit element comprising:
a plurality of vias disposed in a multilayer board;
a first outgoing line electrically connected to a first via which is disposed at one outer portion of the plurality of vias;
a second outgoing line electrically connected to a second via which is disposed at an other outer portion of the plurality of vias;
a first fixed potential layer of the multilayer board, the first fixed potential layer being connected to the plurality of vias; and
at least one second fixed potential layer which is disposed away from the plurality of vias by a clearance and whose potential is the same as that of the first fixed potential layer,
wherein the second fixed potential layer is provided as an inner layer of the multilayer board between the first and second outgoing lines and the first fixed potential layer.

2. The filter circuit element according to claim 1, wherein one end portion of the first via and one end portion of the second via are respectively connected to lands, and the first outgoing line and the second outgoing line are electrically connected to the first via and the second via, respectively, through the lands.

3. The filter circuit element according to claim 1, wherein the first outgoing line and the second outgoing line are electrically connected to the first via and the second via, respectively, by capacity coupling.

4. The filter circuit element according to claim 1, wherein a via whose potential is the same as those of the first and second fixed potential layers is provided around a plurality of the plurality of vias.

5. The filter circuit element according to claim 1, wherein a plurality of the plurality of vias is arranged in a shape of a line.

6. The filter circuit element according to claim 1, wherein a plurality of the plurality of vias is arranged in a shape of a circular arc, and a via whose potential is the same as those of the first and second fixed potential layers is provided at a center of the circular arc.

7. The filter circuit element according to claim 1, wherein said filter circuit element comprises one filter circuit element of a plurality of filter circuit elements, said plurality of filter circuit elements being provided parallel to each other to form differential lines.

8. The filter circuit element according to claim 1, wherein a width of the clearance is set based on a resonance frequency.

9. The filter circuit element according to claim 1, wherein a portion of the clearance comprises a dielectric material.

10. The filter circuit element according to claim 1, wherein lines having a length of one-half of a target effective wavelength are formed on a plurality of layers of the multilayer board, and the lines are so arranged as to partly overlap each other in such a way that each of the lines becomes shifted from a neighboring line by one-quarter of the target effective wavelength in a direction of the length.

11. The filter circuit element according to claim 10, wherein the first and second fixed potential layers are provided on an upper side of a line of a top layer and on a lower side of a line of a bottom layer.

12. The filter circuit element according to claim 11, wherein
an input section and an output section are formed by vias which pierce through the first and second fixed potential layers respectively to be away from the fixed potential layers by a clearance.

13. An electronic circuit device comprising:
a filter circuit element claimed in claim 10, and
an electronic device to which clock signals are applied through the filter circuit element.

14. An electronic circuit device comprising:
a filter circuit element claimed in claim 1, and
an electronic device to which clock signals are applied through the filter circuit element.

15. A filter circuit element claimed in claim 1, wherein the electrical connection between the first outgoing line and the first via comprises a capacity-coupling.

16. A filter circuit element claimed in claim 1, wherein an angle formed by the first outgoing line and the second outgoing line comprises an angle between zero degrees and a right angle.

17. A filter circuit element claimed in claim 1, wherein a row of the plurality of vias is tilted at a predetermined angle in a direction of a length of the first outgoing line.

18. A filter circuit element claimed in claim 1, wherein the first outgoing line comprises a strip line.

19. A filter circuit element in which a first filter formation element and a second filter formation element are disposed side by side and are electrically connected to each other, wherein:
the first filter formation element includes:
a plurality of vias disposed in a multilayer board;
a first outgoing line electrically connected to a first via which is disposed at one outer portion of the plurality of vias;
a second outgoing line electrically connected to a second via which is disposed at the other outer portion of the plurality of vias;
a first fixed potential layer of the multilayer board, the first fixed potential layer being connected to the plurality of vias; and
at least one second fixed potential layer which is disposed away from the plurality of vias by a clearance and whose potential is the same as that of the first fixed potential layer,
wherein the second fixed potential layer is provided as an inner layer of the multilayer board between the first and second outgoing lines and the first fixed potential layer, and
wherein, in the second filter formation element
lines having a length of one-half of a target effective wavelength are formed on a plurality of layers of the multilayer board, and the lines are so arranged as to partly overlap each other in such a way that each of the lines becomes shifted from a neighboring line by one-quarter of the target effective wavelength in a direction of the length; and
the first or second outgoing line comprises a line at an end portion of the second filter formation element.

20. An electronic circuit device comprising
a filter circuit element claimed in claim 19 and an electronic device to which clock signals are applied through the filter circuit element.

* * * * *